US010374343B2

(12) United States Patent
Schmalbuch et al.

(10) Patent No.: US 10,374,343 B2
(45) Date of Patent: Aug. 6, 2019

(54) ELECTRICAL CONNECTION ELEMENT FOR CONTACTING AN ELECTRICALLY CONDUCTIVE STRUCTURE ON A SUBSTRATE

(71) Applicants: SAINT-GOBAIN GLASS FRANCE, Courbevoie (FR); FEW FAHRZEUGELEKTRIK WERK GMBH & CO. KG, Zwenkau (DE)

(72) Inventors: Klaus Schmalbuch, Aachen (DE); Mitja Rateiczak, Wuerselen (DE); Bernhard Reul, Herzogenrath (DE); Bjoern Schneider, Leipzig (DE)

(73) Assignees: SAINT-GOBAIN GLASS FRANCE, Courbevoie (FR); FEW FAHRZEUGELEKTRIK WERK GMBH & CO. KG, Zwenkau (DE)

( * ) Notice: Subject to any disclaimer, the term of this patent is extended or adjusted under 35 U.S.C. 154(b) by 29 days.

(21) Appl. No.: 15/303,729

(22) PCT Filed: Mar. 11, 2015

(86) PCT No.: PCT/EP2015/055007
§ 371 (c)(1),
(2) Date: Oct. 12, 2016

(87) PCT Pub. No.: WO2015/165632
PCT Pub. Date: Nov. 5, 2015

(65) Prior Publication Data

US 2017/0033481 A1 Feb. 2, 2017

(30) Foreign Application Priority Data

Apr. 29, 2014 (EP) .................................... 14166290

(51) Int. Cl.
*H05K 1/09* (2006.01)
*H01R 12/71* (2011.01)
(Continued)

(52) U.S. Cl.
CPC ............. *H01R 12/718* (2013.01); *H01R 4/06* (2013.01); *H01R 12/57* (2013.01);
(Continued)

(58) Field of Classification Search
CPC .......... H05K 1/09; H05K 1/11; H05K 1/0306; H01Q 1/1271; H01Q 1/1278
See application file for complete search history.

(56) References Cited

U.S. PATENT DOCUMENTS 2,644,066 A * 6/1953 Glynn ...................... H05B 3/84 29/517
4,454,378 A 6/1984 Neuroth
(Continued)

FOREIGN PATENT DOCUMENTS

DE 3344091 A1 6/1984
DE 9013380 U1 11/1990
(Continued)

OTHER PUBLICATIONS

International Search Report for International Application No. PCT/EP2015/055007. dated Jun. 8, 2015. 2 pages.
(Continued)

*Primary Examiner* — Steven T Sawyer
(74) *Attorney, Agent, or Firm* — Steinfl + Bruno, LLP

(57) ABSTRACT

An electrical connection element for the electrical contacting of an electrically conductive structure on a substrate is described. The electrical connection element has at least two solid subelements made from different materials, the first subelement being adapted for soldering to the electrically conductive structure, and the second subelement being
(Continued)

adapted for connection to an electrical connection cable. The first subelement and the second subelement are connected to one another by way of at least one rivet.

23 Claims, 4 Drawing Sheets

(51) Int. Cl.

| | |
|---|---|
| ***H01R 4/06*** | (2006.01) |
| ***H01R 12/57*** | (2011.01) |
| ***H05B 3/84*** | (2006.01) |
| ***H01R 13/24*** | (2006.01) |
| ***H01R 43/20*** | (2006.01) |
| *H01R 4/62* | (2006.01) |

(52) U.S. Cl.
CPC ....... *H01R 13/2442* (2013.01); *H01R 43/205* (2013.01); *H05B 3/84* (2013.01); *H01R 4/62* (2013.01); *H01R 2201/26* (2013.01); *H05B 2203/016* (2013.01); *H05B 2203/017* (2013.01)

(56) References Cited

U.S. PATENT DOCUMENTS

| | | | | |
|---|---|---|---|---|
| 5,738,554 | A | 4/1998 | Borger et al. | |
| 9,635,758 | B2 | 4/2017 | Schmalbuch et al. | |
| 9,967,967 | B2 | 5/2018 | Schmalbuch et al. | |
| 2004/0048524 | A1 | 3/2004 | Yuasa et al. | |
| 2005/0112291 | A1* | 5/2005 | Okajima .............. | B23K 1/0008 427/447 |
| 2007/0224842 | A1* | 9/2007 | Hoepfner ................. | H01R 4/02 439/34 |
| 2010/0285685 | A1 | 11/2010 | Ziegler et al. | |
| 2012/0067641 | A1* | 3/2012 | Tokiwa ................ | H01Q 1/1278 174/84 R |
| 2014/0182932 | A1 | 7/2014 | Cholewa et al. | |
| 2015/0264800 | A1 | 9/2015 | Schmalbuch et al. | |
| 2015/0296615 | A1 | 10/2015 | Schmalbuch et al. | |
| 2016/0240935 | A1 | 8/2016 | Katakura | |
| 2018/0083339 | A1 | 3/2018 | Werner et al. | |
| 2018/0330845 | A1 | 11/2018 | Reul et al. | |

FOREIGN PATENT DOCUMENTS

| | | | |
|---|---|---|---|
| DE | 4439645 | C1 | 4/1996 |
| DE | 10338297 | A1 | 6/2004 |
| DE | 202013006781 | U1 | 8/2013 |
| DE | 202013006775 | U1 | 9/2013 |
| EP | 0477069 | B1 | 7/1994 |
| EP | 1488972 | A1 | 12/2004 |
| EP | 2361450 | A1 | 8/2011 |
| JP | S565394 | U | 1/1981 |
| JP | H06290855 | A | 10/1994 |
| JP | 2004189023 | A | 7/2004 |
| JP | 2010539661 | A | 12/2010 |
| JP | 2015069893 | A | 4/2015 |
| KR | 101077081 | B1 | 10/2011 |
| WO | 2008/137946 | A1 | 11/2008 |
| WO | 2010/057641 | A1 | 5/2010 |
| WO | 2012152543 | A1 | 11/2012 |
| WO | 2014/079594 | A1 | 5/2014 |

OTHER PUBLICATIONS

Written Opinion for PCT Application No. PCT/EP2015/055007 filed Mar. 11, 2015 on behalf of Saint-Gobain Glass France. dated Jun. 8, 2015. 15 pages. (German original + English translation).

International Search Report for International Application No. PCT/EP2015/076186 filed Nov. 10, 2015 on behalf of Saint-Gobain Glass France. dated Feb. 5, 2016. 4 pages (English Translation + German Original).

International Search Report for International Application No. PCT/EP2016/059716 filed May 1, 2016 on behalf of Saint-Gobain Glass France, dated Jul. 22, 2016. 6 pages (English Translation + German Original).

Non-Final Office Action for U.S. Appl. No. 15/529,071, filed May 23, 2017, on behalf of Saint-Gobain Glass France, dated Dec. 10, 2018. 18 pages.

Restriction Requirement for U.S. Appl. No. 15/529,071, filed May 23, 2017, on behalf of Saint-Gobain Glass France, dated Sep. 18, 2018. 5 pgs.

Written Opinion for International Application No. PCT/EP2015/076186 filed Nov. 10, 2015 on behalf of Saint-Gobain Glass France, dated Feb. 5, 2016. 11 pp. (English Translation + German Original).

Written Opinion for International Application No. PCT/EP2016/059716 filed May 1, 2016 on behalf of Saint-Gobain Glass France, dated Jul. 22, 2016. 15 pages (English Translation + German Original).

* cited by examiner

ELECTRICAL CONNECTION ELEMENT FOR CONTACTING AN ELECTRICALLY CONDUCTIVE STRUCTURE ON A SUBSTRATE

CROSS-REFERENCE TO RELATED APPLICATIONS

The present application is the U.S. National Stage of International Patent Application No. PCT/EP2015/055007 filed on Mar. 11, 2015 which, in turn, claims priority to European Patent Application No. 14166290.8 filed on Apr. 29, 2014.

The invention relates to an electrical connection element, a pane with the electrical connection element, a method for producing the connection element, and its use.

The invention relates in particular to an electrical connection element for contacting electrically conductive structures, for example, heating conductors or antenna conductors on panes for motor vehicles. The electrically conductive structures are connected to the onboard electrical system via the soldered-on electrical connection elements. Due to different coefficients of thermal expansion of the materials used, mechanical stresses occur during production and operation that strain the panes and can cause breakage of the pane.

Lead-containing solders have high ductility that can compensate the mechanical stresses occurring between an electrical connection element and the pane by plastic deformation. However, because of the End of Life Vehicles Directive 2000/53/EC, lead-containing solders must be replaced by leadfree solders within the EC. The Directive is referred to, in summary, by the acronym ELV (End of Life Vehicles). Its objective is, as a result of the massive increase in disposable electronics, to ban extremely problematic components from the products. The substances affected are lead, mercury, and cadmium. This relates, among other things, to the implementation of leadfree soldering materials in electrical applications on glass and the introduction of corresponding replacement products.

Leadfree solders typically have markedly reduced ductility and are, consequently, incapable of compensating mechanical stresses to the same extent as lead-containing solders. The effort must, consequently, be made, in particular in the case of solders with leadfree soldering compounds to prevent mechanical stresses, something which is, for example, possible by means of a suitable selection of the material of the connection element. If the difference in the coefficients of thermal expansion of the substrate, customarily soda lime glass, and the connection element is small, only slight mechanical stresses occur.

In WO 2012/152543 A1, for example, chromium-containing (or stainless) steels have been proposed as a particularly suitable material, which, moreover, are advantageous economically. As a further development, multi-piece connection elements are also conceivable. Such connection elements can, be made of a plurality of solid subelements made from different material, with one subelement provided for contacting the pane and the other subelement for contacting the electrical connection cable. The material of the subelement for contacting the pane can then be selected primarily in view of a suitable coefficient of thermal expansion. The material of the subelement for contacting the connection cable can, on the contrary, be selected in view of other criteria, such as optimum electrical conductivity or good formability.

The subelements must be durably stably connected to one another. The person skilled in the art will, in this case, first and foremost, consider the welding of the subelements. However, if the subelements have, due to their different materials, very different melting temperatures, problem free welding is not possible. Sometimes, at the temperature that is necessary to melt one subelement, the other subelement can already be damaged.

The object of the present invention is to provide a multi-piece electrical connection element whose subelements are connected to one another in an improved manner as well as a pane with this connection element.

The object of the present invention is accomplished according to the invention by a pane with an electrical connection element in accordance with the various embodiments described in the present disclosure.

The electrical connection element according to the invention for the electrical contacting of an electrically conductive structure on a substrate, comprises at least two solid subelements made from different material (or different material composition), with the first subelement provided to be soldered to the electrically conductive structure and the second subelement provided to be connected to an electrical connection cable. The first subelement and the second subelement are connected to one another according to the invention by means of at least one rivet.

The connection by means of rivets is durably stable and makes no further demands on the solid subelements. The material of the subelements can thus be selected without regard to their connection to one another. Thus, in particular, for the first subelement, a material can be selected whose coefficient of thermal expansion has the least possible difference from that of the substrate, whereas, for the second subelement, a material can be selected that has the highest possible electrical conductivity and/or good bendability. Other criteria, for example, a similar melting point as it occurs in the case of a welded connection, need not be taken into account. This is a major advantage of the present invention.

The subelements of the connection element are implemented solid according to the invention. This means a rigid, although possibly quite ductile, but not limp design. The subelement remains in the desired shape and position after forming. In the context of the invention, non-solid, limp forms, such as conventional cables or flat conductors, must not be considered as subelements of the connection element.

The difference between the melting temperature of the material of the first subelement and the melting temperature of the material of the second subelement is, in an advantageous embodiment, greater than 200° C., preferably greater than 300° C., particularly preferably greater than 400° C. With such connection elements, the advantages according to the invention are particularly significant since the obvious connection by means of welding is no longer satisfactorily feasible with such differences of the melting temperature.

The invention further comprises a pane with at least one electrical connection element, comprising at least:

- a substrate,
- an electrically conductive structure on a region of the substrate, and
- at least one connection element according to the invention, wherein the first subelement is connected to a region of the electrically conductive structure via a soldering compound.

The second subelement is preferably arranged on the surface of the first subelement facing away from the substrate. It is provided for contacting an electrical connection cable. The connection cable connects the electrically conductive structure on the substrate to an external functional element, for example, a power supply or a receiver. For this, the connection cable is guided away from the pane starting from the connection element preferably beyond the side edges of the pane. The connection cable can, in principle, be any connection cable that is known to the person skilled in the art for the electrical contacting of an electrically conductive structure, for example, a flat conductor, a stranded wire conductor, or a solid wire conductor. The connection between the second subelement of the connection element and the connection cable can be done in any manner familiar to the person skilled in the art, for example, by soldering, welding, screwing, via an electrically conductive adhesive, or as a plug connection.

The substrate preferably contains glass, particularly preferably soda lime glass. The substrate is preferably a glass pane, in particular, a window pane. However, the substrate can, in principle, also contain other types of glass, for example, quartz glass or borosilicate glass, or polymers, preferably polyethylene, polypropylene, polycarbonate, polymethyl methacrylate, polystyrene, polybutadiene, polynitriles, polyesters, polyurethanes, polyvinyl chloride, polyacrylate, polyamide, polyethylene terephthalate, and/or copolymers or mixtures thereof.

The substrate is preferably transparent or translucent. The substrate preferably has a thickness from 0.5 mm to 25 mm, particularly preferably from 1 mm to 10 mm, and most particularly preferably from 1.5 mm to 5 mm.

In a preferred embodiment, the difference between the coefficient of thermal expansion of the substrate and the coefficient of thermal expansion of the first subelement is less than 5x10−6/° C., preferably less than $3\times10^{-6}$/° C. By means of such a small difference, critical thermal stresses as a result of the soldering procedure can be advantageously avoided and better adhesion is achieved.

The coefficient of thermal expansion of the substrate is preferably from $8\times10^{-6}$/° C. to $9\times10^{-6}$/° C. The substrate preferably contains glass, in particular soda lime glass, which preferably has a coefficient of thermal expansion from $8.3\times10^{-6}$/° C. to $9\times10^{-6}$/° C. in a temperature range from 0° C. to 300° C.

The coefficient of thermal expansion of the first subelement of the connection element according to the invention is, in an advantageous embodiment, from $4\times10^{-6}$/° C. to $15\times10^{-6}$/° C., preferably from $9\times10^{-6}$/° C. to $13\times10^{-6}$/° C., particularly preferably from $10\times10^{-6}$/° C. to $11.5\times10^{-6}$/° C., most particularly preferably from $10\times10^{-6}$/° C. to $11\times10^{-6}$/° C. and, in particular, from $10\times10^{-6}$/° C. to $10.5\times10^{-6}$/° C. in a temperature range from 0° C. to 300° C.

The first subelement of the connection element according to the invention preferably contains at least one iron-containing alloy. The first subelement particularly preferably contains at least 50 wt.-% to 89.5 wt.-% iron, 0 wt.-% to 50 wt.-% nickel, 0 wt.-% to 20 wt.-% chromium, 0 wt.-% to 20 wt.-% cobalt, 0 wt.-% to 1.5 wt.-% magnesium, 0 wt.-% to 1 wt.-% silicon, 0 wt.-% to 1 wt.-% carbon, 0 wt.-% to 2 wt.-% manganese, 0 wt.-% to 5 wt.-% molybdenum, 0 wt.-% to 1 wt.-% titanium, 0 wt.-% to 1 wt.-% niobium, 0 wt.-% to 1 wt.-% vanadium, 0 wt.-% to 1 wt.-% aluminum, and/or 0 wt.-% to 1 wt.-% tungsten.

The first subelement can, for example, contain an iron-nickel-cobalt alloy, such as Kovar (FeCoNi) with a coefficient of thermal expansion of typically roughly $5\times10^{-6}$/° C. The composition of Kovar is, for example, 54 wt.-% iron, 29 wt.-% nickel, and 17 wt.-% cobalt.

In a particularly preferred embodiment, the first subelement of the connection element contains a chromium-containing steel. Chromium-containing, in particular so-called stainless or corrosion resistant steel is available cost-effectively. Connection elements made of chromium-containing steel has, in addition, compared to many conventional connection elements, for example, made of copper, high rigidity, which results in advantageous stability of the connection element. Thus, for example, torsions can be avoided during a shaping of the second subelement. In addition, chromium-containing steel has, compared to many conventional connection elements, for example, those made of titanium, improved solderability, which results from higher thermal conductivity.

The first subelement preferably contains a chromium-containing steel with a chromium content greater than or equal to 10.5 wt.-%. Further alloy components such as molybdenum, manganese, or niobium lead to improved corrosion resistance or altered mechanical properties such as tensile strength or cold formability.

The first subelement of the connection element particularly preferably contains at least 66.5 wt.-% to 89.5 wt.-% iron, 10.5 wt.-% to 20 wt.-% chromium, 0 wt.-% to 1 wt.-% carbon, 0 wt.-% to 5 wt.-% nickel, 0 wt.-% to 2 wt.-% manganese, 0 wt.-% to 2.5 wt.-% molybdenum, 0 wt.-% to 2 wt.-% niobium, and 0 wt.-% to 1 wt.-% titanium. The connection element can additionally contain admixtures of other elements, including vanadium, aluminum, and nitrogen.

The first subelement most particularly preferably contains at least 73 wt.-% to 89.5 wt.-% iron, 10.5 wt.-% to 20 wt.-% chromium, 0 wt.-% to 0.5 wt.-% carbon, 0 wt.-% to 2.5 wt.-% nickel, 0 wt.-% to 1 wt.-% manganese, 0 wt.-% to 1.5 wt.-% molybdenum, 0 wt.-% to 1 wt.-% niobium, and 0 wt.-% to 1 wt.-% titanium. The connection element can additionally contain admixtures of other elements, including vanadium, aluminum, and nitrogen.

The connection element according to the invention contains in particular at least 77 wt.-% to 84 wt.-% iron, 16 wt.-% to 18.5 wt.-% chromium, 0 wt.-% to 0.1 wt.-% carbon, 0 wt.-% to 1 wt.-% manganese, 0 wt.-% to 1 wt.-% niobium, 0 wt.-% to 1.5 wt.-% molybdenum, and 0 wt.-% to 1 wt.-% titanium. The connection element can additionally contain admixtures of other elements, including vanadium, aluminum, and nitrogen.

Particularly suitable chromium-containing steels are steels of the material numbers 1.4016, 1.4113, 1.4509, and 1.4510 in accordance with EN 10 088-2.

The second subelement of the connection element according to the invention contains, in a preferred embodiment, copper, for example, electrolytic copper. Such a second subelement has advantageously high electrical conductivity. Moreover, such a subelement is advantageously formable, which can be desirable or necessary for connection to the connection cable. Thus, the second subelement can, for example, be provided with an angle, by means of which the connection direction of the connection cable is adjustable.

The second subelement can also contain a copper-containing alloy, such as brass or bronze alloys, for example, nickel silver or constantan.

The second subelement preferably has electrical resistance from 0.5 μOhm·cm to 20 μOhm·cm, particularly preferably from 1.0 μOhm·cm to 15 μOhm·cm, most particularly preferably from 1.5 μOhm·cm to 11 μOhm·cm.

The second subelement particularly preferably contains 45.0 wt.-% to 100 wt.-% copper, 0 wt.-% to 45 wt.-% zinc, 0 wt.-% to 15 wt.-% tin, 0 wt.-% to 30 wt.-% nickel, and 0 wt.-% to 5 wt.-% silicon.

Particularly suitable as the material of the second subelement is electrolytic copper with the material number CW004A (formerly 2.0065) and CuZn30 with the material number CW505L (formerly 2.0265).

The material of the rivet according to the invention can, in principle, be freely selected by the person skilled in the art depending on the requirements of the application. The rivet can, for example, contain copper or copper-containing alloys such as brass or bronze, iron or iron-containing alloy such as steel, chromium-containing or stainless steel, aluminum, or aluminium-containing alloys, or titanium.

In a preferred embodiment, the rivet contains copper or a copper-containing alloy, in particular copper. This is particularly advantageous with regard to the electrical conductivity and the formability of the rivet required for riveting.

However, the rivet can also be implemented in one piece with the first or the second subelement of the connection element. In this case, the material of the rivet is, of course, governed by the material of the corresponding subelement.

The geometric dimensions of the rivet are reasonably governed by the dimensions of the connection element. The rivet has, in the case of typical connection elements, for example, a length of 0.2 mm to 12 mm, preferably from 0.8 mm to 3 mm and a width from 0.5 mm to 5 mm, preferably from 1 mm to 3 mm.

The invention is not limited to a specific shape of the connection element. The invention can, instead, be applied to any connection elements that are implemented in multiple parts made of solid subelements. Care must, of course, be taken that the solder surface of the first subelements, i.e., that surface that is provided to function as a contact surface to the substrate, is not compromised by a protruding rivet.

The material thickness of the first subelement and of the second subelement is preferably from 0.1 mm to 4 mm, particularly preferably from 0.2 mm to 2 mm, most particularly preferably from 0.5 mm and 1 mm. The material thickness is preferably constant, which is particularly advantageous with regard to simple production of the subelement.

The dimensions of the connection element can be freely selected by the person skilled in the art depending on the requirements of the individual case. The connection element has, for example, a length and a width from 1 mm to 50 mm. The length of the connection element is preferably from to, particularly preferably from to. The width of the connection element is preferably from 10 mm to 30 mm, particularly preferably from 2 mm to 10 mm. Connection elements with these dimensions are particularly easy to handle and are particularly suited for the electrical contacting of conductive structures on panes.

In a preferred embodiment, the first subelement is implemented in the shape of a bridge. Bridge-shaped connection elements are familiar per se to the person skilled in the art. They typically include 2 foot regions, on whose surface facing the substrate are arranged the contact surfaces via which the connection element is connected to the substrate via the soldering compound. Between the foot regions is arranged a bridging region, which typically includes an elevated central section that is arranged parallel to the foot regions. The bridging region is not intended to be connected directly to the conductive structure via the soldering compound. The second subelement is preferably arranged on the surface of the bridging region facing away from the foot regions. The shape of the second subelement can likewise be freely selected by the person skilled in the art. The second subelement preferably has an elongated shape, in particular a rectangular shape, which has an flat surface for optimum installation on the first subelement.

Bridge-shaped connection elements have proved their worth for the contacting of electrically conductive structures on glass panes. Moreover, they provide, in the bridging section between the foot regions to be soldered, an advantageous capability for riveting the second subelement.

Preferably, the first and the second subelements have, respectively, at least one, particularly preferably, exactly one, hole that is matched to the size of the intended rivet. The holes of the first and the second subelements are arranged to coincide such that the rivet can be guided through both holes and can thus connect the subelements durably stably to one another. A section of the rivet protruding beyond the surface of the first of subelement in the direction of the substrate is not problematic in this embodiment since the bridging section of the first subelement is not directly connected to the substrate; instead, there is an intermediate space between the bridging section and the substrate surface.

In a particularly advantageous improvement, the second subelement is dimensioned such that standard motor vehicle flat tabs with a height of 0.8 mm and a width of either 4.8 mm, 6.3 mm, or 9.5 mm can be attached on the free end of the subelement. The embodiment of the second subelement with a width of 0.3 mm is particularly preferably used since this corresponds to the motor vehicle tab in accordance with DIN 46244 used in this sector. Standardization of the connection bridge to fit the size of the conventional motor vehicle flat tab yields a simple, and also reversible, capability of connecting the conductive structure of the substrate to the onboard voltage. However, alternatively, the electrical contacting of the connection element can also be done via a soldered connection, a crimped connection, or a conductive adhesive.

In an alternative preferred embodiment, the second subelement of the connection element is implemented in the shape of a bridge with the two foot regions and the bridging region arranged therebetween. The first subelement is implemented as a flat plate with, for example, a rectangular or a round outline and arranged on the underside of the foot regions of the second subelement. The first subelement thus forms a compensator plate between the second subelement and the substrate. Preferably, a first subelement is provided for each of the two foot regions, i.e., a total of two first subelements.

In this embodiment, conventional bridge-shaped connection elements, economically available commercially, made, for example, of copper, can be used as second subelements. The first subelements as compensator plates can, in contrast, be selected such that thermal stresses on the substrate are prevented.

Since the first subelements as compensator plates are usually full-surface bonded directly to the substrate via the soldering compound, with simple riveting, the problem presents itself that a part of the rivet would protrude beyond the soldering surface. Consequently, in a preferred embodiment, the rivet is implemented in one piece with the first subelement and arranged on the first subelement surface opposite the soldering surface. The rivet is then guided through a suitable hole in the second subelement.

In an alternative preferred embodiment, the first subelement as a compensator plate has, preferably roughly centrally, a depression on the soldering surface. In the region of the depression, the first subelement has a hole, through which the rivet is guided. After producing the positive-locking connection of the subelements by shaping the rivet, the protruding portion of the rivet is arranged inside the depression and does not protrude beyond the otherwise flat soldering surface.

The electrically conductive structure according to the invention preferably has a layer thickness from 5 μm to 40 μm, particularly preferably from 5 μm to 20 μm, most particularly preferably from 8 μm to 15 μm and, in particular, from 10 μm to 12 μm. The electrically conductive structure according to the invention preferably contains silver, particularly preferably silver particles and glass frits.

The soldering compound according to the invention is, in a preferred embodiment, leadfree. This is particularly advantageous with regard to the environmental impact of the pane with an electrical connection element according to the invention. In the context of the invention, "leadfree soldering compound" means a soldering compound which, in accordance with the EC Directive "2002/95/EC on the Restriction of the Use of Certain Hazardous Substances in Electrical and Electronic Equipment", has a lead content less than or equal to 0.1 wt.-%, preferably contains no lead.

The multi-piece connection elements according to the invention are particularly advantageous for leadfree soldering. The material of the first subelement, which is soldered with the conductive structure directly on the substrate, can be coordinated with the material of the substrate such that thermal stresses that can be critical due to the low ductility of typical leadfree soldering compound are avoided.

The soldering compound preferably contains tin and bismuth, indium, zinc, copper, silver, or compositions thereof. The tin content in the solder composition according to the invention is from 3 wt.-% to 99.5 wt.-%, preferably from 10 wt.-% to 95.5 wt.-%, particularly preferably from 15 wt.-% to 60 wt.-%. The content of bismuth, indium, zinc, copper, silver, or compositions thereof is, in the solder composition according to the invention, from 0.5 wt.-% to 97 wt.-%, preferably 10 wt.-% to 67 wt.-%, with the content of bismuth, indium, zinc, copper, or silver possibly being 0 wt.-%. The solder composition can contain nickel, germanium, aluminum, or phosphorous with a content from 0 wt.-% to 5 wt.-%. The solder composition according to the invention most particularly preferably contains Bi40Sn57Ag3, Sn40Bi57Ag3, Bi59Sn40Ag1, Bi57Sn42Ag1, In97Ag3, Sn95.5Ag3.8Cu0.7, Bi67In33, Bi33In50Sn17, Sn77.2In20Ag2.8, Sn95Ag4Cu1, Sn99Cu1, Sn96.5Ag3.5, Sn96.5Ag3Cu0.5, Sn97Ag3, or mixtures thereof.

In an advantageous embodiment, the soldering compound contains bismuth. It has been demonstrated that a bismuth-containing soldering compound results in a particularly good adhesion of the connection element according to the invention on the pane, whereby damage to the pane can be avoided. The content of bismuth in the soldering compound composition is preferably from 0.5 wt.-% to 97 wt.-%, particularly preferably from 10 wt.-% to 67 wt.-%, and most particularly preferably from 33 wt.-% to 67 wt.-%, in particular from 50 wt.-% to 60 wt.-%. The soldering compound preferably contains, in addition to bismuth, tin and silver or tin, silver, and copper. In a particularly preferred embodiment, the soldering compound contains at least 35 wt.-% to 69 wt.-% bismuth, 30 wt.-% to 50 wt.-% tin, 1 wt.-% to 10 wt.-% silver, and 0 wt.-% to 5 wt.-% copper. In a most particularly preferred embodiment, the soldering compound contains at least 49 wt.-% to 60 wt.-% bismuth, 39 wt.-% to 42 wt.-% tin, 1 wt.-% to 4 wt.-% silver, and 0 wt.-% to 3 wt.-% copper.

In another advantageous embodiment, the soldering compound contains from 90 wt.-% to 99.5 wt.-% tin, preferably from 95 wt.-% to 99 wt.-%, particularly preferably from 93 wt.-% to 98 wt.-%. The soldering compound preferably contains, in addition to tin, from 0.5 wt.-% to 5 wt.-% silver and from 0 wt.-% to 5 wt.-% copper.

The layer thickness of the soldering compound is preferably less than or equal to $6.0\times10^{-4}$ m, particularly preferably less than $3.0\times10^{-4}$ m.

The soldering compound flows out with an outflow width of preferably less than 1 mm from the intermediate space between the solder region of the connection element and the electrically conductive structure. In a preferred embodiment, the maximum outflow width is less than 0.5 mm and, in particular, roughly 0 mm. This is particularly advantageous with regard to the reduction of mechanical stresses in the pane, the adhesion of the connection element, and the savings in the amount of solder. The maximum outflow width is defined as the distance between the outer edges of the solder region and the point of the soldering compound crossover, at which the soldering compound drops below a layer thickness of 50 μm. The maximum outflow width is measured on the solidified soldering compound after the soldering process. A desired maximum outflow width is obtained through a suitable selection of soldering compound volume and vertical distance between the connection element and the electrically conductive structure, which can be determined by simple experiments. The vertical distance between the connection element and the electrically conductive structure can be predefined by an appropriate process tool, for example, a tool with an integrated spacer. The maximum outflow width can even be negative, i.e., pulled back into the intermediate space formed by the solder region of the electrical connection element and an electrically conductive structure. In an advantageous embodiment of the pane according to the invention, the maximum outflow width is pulled back in a concave meniscus in the intermediate space formed by the solder region of the electrical connection element and the electrically conductive structure. A concave meniscus is created, for example, by increasing the vertical distance between the spacer and the conductive structure during the soldering process, while the solder is still fluid. The advantage resides in the reduction of mechanical stresses in the pane, in particular, in the critical region that is present with a large soldering compound crossover.

In an advantageous improvement, the solder surface of the first subelement has spacers. The spacers are preferably implemented in one piece with the first subelement, for example, by stamping or deep drawing. The spacers preferably have a width from $0.5\times10^{-4}$ m to $10\times10^{-4}$ m and a height from $0.5\times10^{-4}$ m to $5\times10^{-4}$ m, particularly preferably from $1\times10^{-4}$ m to $3\times10^{-4}$ m. By means of the spacers, a homogeneous, uniformly thick, and uniformly fused layer of the soldering compound is obtained. Thus, mechanical stresses between the connection element and the pane can be reduced, and the adhesion of the connection element can be improved. This is particularly advantageous with the use of lead-free soldering compounds that can compensate mechanical stresses less well due to their lower ductility compared to lead-containing soldering compounds.

In an advantageous improvement, at least one contact bump, which serves for contacting the connection element with the soldering tool during the soldering process, is arranged on the surface of the connection element facing away from the substrate. The contact bump is preferably curved convexly at least in the region of contacting with the soldering tool. The contact bump preferably has a height of 0.1 mm to 2 mm, particularly preferably of 0.2 mm to 1 mm. The length and width of the contact bump is preferably between 0.1 and 5 mm, most particularly preferably between 0.4 mm and 3 mm. The contact bumps are preferably implemented in one piece with the connection element, for example, by stamping or deep drawing. For the soldering, electrodes whose contact side is flat can be used. The electrode surface is brought into contact with the contact bump. The electrode surface is arranged parallel to the surface of the substrate. The contact region between the electrode surface and the contact bump forms the solder joint. The position of the solder joint is determined by the point on the convex surface of the contact bump that has the greatest vertical distance from the surface of the substrate. The position of the solder joint is independent of the position of the solder electrode on the connection element. This is particularly advantageous with regard to a reproducible, uniform heat distribution during the soldering process. The heat distribution during the soldering process is determined by the position, the size, the arrangement, and the geometry of the contact bump.

The contact bump can also be formed by the section of the rivet according to the invention protruding beyond the connection element, in particular when the rivet head is implemented as a spherical segment, for example, as a hemisphere. The contact bump is then advantageously produced at the time of the riveting without any further effort or cost.

The first subelement and/or the second subelement of the electrical connection element can have a coating (wetting layer), which contains, for example, nickel, copper, zinc, tin, silver, gold, or alloys or layers thereof, preferably silver. By this means, improved wetting of the connection element with the soldering compound and improved adhesion of the connection elements are obtained. Moreover, by means of such a coating, the electrical conductivity of the connection element can be increased.

In an advantageous embodiment, the first subelement and/or the second subelement is provided with an adhesion-promoting layer, preferably made of nickel and/or copper, and, additionally, provided with a silver-containing layer. The connection element according to the invention is most particularly preferably coated with 0.1 μm to 0.3 μm nickel and, thereupon, 3 μm to 20 μm of silver.

The shape of the electrical connection element can form one or a plurality of solder depots in the intermediate space of the connection element and the electrically conductive structure. The solder depots and wetting properties of the solder on the connection element prevent the outflow of the soldering compound from the intermediate space. Solder depots can be rectangular, rounded, or polygonal in design.

The object of the invention is further accomplished by a method for producing an electrical connection element for the electrical contacting of an electrically conductive structure on a substrate, wherein (a) a first solid subelement and a second solid subelement are prepared, wherein the subelements are made of a different material and wherein the first subelement is provided to be soldered to the electrically conductive structure and wherein the second subelement is provided to be connected to an electrical connection cable, (b) the first subelement and the second subelement are arranged one atop the other, and (c) the first subelement and the second subelement are connected to one another by means of at least one rivet.

The object of the invention is further accomplished by a method for producing a pane with at least one connection element, wherein a) soldering compound is applied on the contact surfaces of the first subelement of a connection element according to the invention, b) the connection element with the soldering compound is arranged on a region of an electrically conductive structure that is applied on a region of a substrate, and d) the connection element is connected to the electrically conductive structure under application of energy.

The soldering compound is preferably applied to the connection element as a platelet or a flattened drop with a fixed layer thickness, volume, shape, and arrangement. The layer thickness of the soldering compound platelet is preferably less than or equal to 0.6 mm. The shape of the soldering compound platelet is preferably governed by the shape of the contact surface of the connection element and is, for example, rectangular, circular, oval, or rectangular with rounded corners, or rectangular with semicircles positioned on two opposite sides.

The introduction of energy during the electrical connecting of an electrical connection element and an electrically conductive structure occurs preferably by means of punch soldering, thermode soldering, piston soldering, laser soldering, hot air soldering, induction soldering, resistance soldering, and/or with ultrasound.

The electrically conductive structure can be applied on the substrate by methods known per se, for example, by screen printing methods.

The invention further includes the use of an electrical connection element according to the invention for the electrical contacting of an electrically conductive structure on a substrate, wherein the substrate (6) is preferably a motor vehicle window pane, in particular windshield, rear window, side window, and/or roof panel of a motor vehicle.

The pane according to the invention with the connection element according to the invention is preferably used in buildings or in means of transportation for travel on land, in the air, or on water, in particular in rail vehicles or motor vehicles, preferably as a windshield, rear window, side window, and/or roof panel, in particular as a heatable pane or as a pane with an antenna function.

The invention is explained in detail with reference to drawings and exemplary embodiments. The drawings are schematic representations and not true to scale. The drawings in no way restrict the invention. They depict:

FIG. 1 a perspective view of an embodiment of the electrical connection element according to the invention, FIG. 2 a section A-A' through the connection element of FIG. 1, FIG. 3 a perspective view of the pane according to the invention with the connection element of FIG. 1, FIG. 4 a perspective view another embodiment of the electrical connection element according to the invention, FIG. 5 a cross-section through the first subelement of the connection element of FIG. 4, FIG. 6 a cross-section through an alternative embodiment of the first subelement, FIG. 7 a flowchart of an embodiment of the method according to the invention for producing a connection element according to the invention, and FIG. 8 a flowchart of an embodiment of the method according to the invention for producing a pane with the connection element according to the invention.

FIG. 1 and FIG. 2 each depict a detail of an electrical connection element according to the invention 1. The connection element 1 is implemented in multiple pieces and consists of a first subelements 2 and a second subelement 3. The first subelement 2 is provided to be soldered to an electrically conductive structure on a substrate, in particular a motor vehicle window pane made of glass. The second subelement 3 is provided it to be contacted to a connection cable, by which means the electrically conductive structure can be connected via the connection element 1 to an external power supply.

In order to avoid critical mechanical stresses as a result of temperature changes, the coefficient of thermal expansion of the first subelement 2 is coordinated with the coefficient of thermal expansion of the second subelement 3. The first subelement 2 is made of chromium-containing steel of the material number 1.4509 in accordance with EN 10 088-2 (ThyssenKrupp Nirosta® 4509) with a coefficient of thermal expansion of $10.5\times10^{-6}$/° C. in the temperature range from 20° C. to 300° C. Motor vehicle window panes are typically made of soda lime glass, which has a coefficient of thermal expansion of roughly $9\cdot10^{-6}$/° C. Due to the small difference in the coefficients of thermal expansion, critical thermal stresses can be avoided.

The first subelement 2 has a bridge shape. The subelement 2 comprises flat foot regions each with a flat contact surface on its underside. A bridging region is arranged between the foot regions. The contact surfaces are provided to be connected via a soldering compound to a conductive structure, whereas the bridging region is not to be impinged upon by the soldering compound. The subelement 2 has a length of 24 mm and a width of 4 mm in the bridging region and a width of 8 mm in the foot region. The material thickness of the subelement 2 is 0.8 mm.

The second subelement 3 is not to be soldered directly on the electrically conductive structure, so its coefficient of thermal expansion need not be taken into account. The second subelement 3 should have high electrical conductivity and good formability, which is advantageous for the contacting with the connection cable. Consequently, the second subelement 3 is made of copper of the material number CW004A (Cu-ETP) with an electrical resistance of 1.8 μOhm·cm. The subelement 3 is provided with a wetting layer made of silver to further improve the conductivity.

The second subelement 3 is arranged on the top of the first subelement 2 in the bridging region. The second subelement 3 is aligned flush with an outer edge of the first subelement 2 and points beyond the opposite outer edge in the direction of the widened foot regions. The second subelement 3 has a material thickness of 0.8 mm, a width of 6.3 mm, and a length of 27 mm.

In order to connect the subelements 2 and 3 to one another, it would be obvious for the person skilled in the art to solder them to one another. However, in the present exemplary embodiment, this is not possible without problems. Steel of the material number 1.4509 has a melting temperature of roughly 1505° C.; copper, in contrast roughly 1083° C. The great difference in the melting points results in great problems for welding. Thus, the connection element 1 must be heated to a very high temperature in order to fuse the first subelements 2 thereon. In the process, the second subelement 3 can be damaged. For example, the silver-containing wetting layer can be damaged.

The first subelement 2 and the second subelement 3 are connected to one another according to the invention by means of a rivet 4. By means of the rivet 4, the subelements 2, 3 can be durably stably connected independent of the materials used. The rivet is also made, for example, of Cu-ETP.

The first subelement 2 and the second subelement 3 are respectively provided with a suitable hole, which are arranged coinciding with one another such that the rivet 4 can be guided through both holes. By subsequent reshaping of the rivet 4, the positive connection of the subelements 2, 3 is produced, with a thickened part of the rivet protruding beyond the top and the bottom, respectively. Since the bridging region of the first subregion 2 in the embodiment depicted has an adequate distance from the surface of the substrate, the protrusion of the rivet 4 on the bottom is unproblematic.

FIG. 3 depicts an embodiment of the pane according to the invention in the region of the electrical connection element 3. The pane is a rear window of an automobile and comprises a substrate 6, which is a 3-mm-thick thermally prestressed single pane safety glass made of soda lime glass. The substrate 6 has a width of 150 cm and a height of 80 cm. An electrically conductive structure 5 in the form of a heating conductor structure is printed on the substrate 6. The electrically conductive structure 5 includes silver particles and glass frits. In the edge region of the pane, the electrically conductive structure 5 is widened to a width of roughly 10 mm and forms the contact surface for the electrical connection element 1. The connection element 1 serves for the electrical contacting of the electrically conductive structure 5 with an external power supply via a connection cable (not shown). The electrical contacting is concealed for an observer outside the automobile by a masking screenprint 8 between the electrically conductive structure 5 and the substrate 6.

The contact surfaces of the first subelement 2 of the connection element 1 are durably connected electrically and mechanically to the electrically conductive structure 5 via a soldering compound 7. The soldering compound 7 is lead-free and contains 57 wt.-% bismuth, 40 wt.-% tin, and 3 wt.-% silver. The soldering compound 4 has a thickness of 250 μm.

FIG. 4 depicts another embodiment of the connection element according to the invention 1. The second subelement 3 is implemented in the shape of a bridge and is made of copper. A first subelement 2 made of chromium-containing steel of the material number 1.4509 is arranged on the bottom of each foot region of the second subelement 3. The first subelements 2 form compensator plates, by means of which the copper-containing bridge and a glass substrate do not come into direct contact, a situation which would be disadvantageous due to the high difference of the coefficients of thermal expansion. The first subelements are already prefabricated bearing the soldering compound 7.

Riveting of these subelements 2 as in the exemplary embodiment of FIG. 1, wherein a rivet 4 is guided through the entire subelement 2, is not possible here because a protruding rivet 4 would compromise the solder surface (contact surface with the soldering compound) of the subelement 2.

FIG. 5 depicts a cross-section through a first subelement 2 in accordance with FIG. 4. In this embodiment, the rivet 4 is implemented in one piece with the subelement 2 and is arranged on the side of the subelement 2 opposite the solder surface of the subelement 2 angeordnet. Thus, a flat solder surface is provided.

FIG. 6 depicts another alternative embodiment of the first subelement 2. The subelement 2 is, as in FIG. 5, implemented substantially flat, with, approx. in the middle, a depression being introduced into the solder surface. In the region of this depression, a hole provided for passage of a rivet is arranged. The protruding portion of the rivet can be accommodated in the depression such that it does not protrude beyond the solder surface and disturb the connection between the connection element and the substrate. The depression also facilitates the application of the soldering compound on the connection element before soldering. Moreover, excess soldering compound can be accommodated in the depression during soldering such that the outflow width of the soldering compound beyond the side edges of the solder surfaces can be reduced. Mechanical stresses are thus further reduced.

The shape of the depression can be optimized for other functionalities such as the application of the soldering compound. In the embodiment depicted, the profile of the depression has a slight cutback which results in a more stable connection during cold injection of the soldering compound. Other shapes are, however, also possible for the depression, for example, with profiles in the shape of a circular segment or rectangle.

In the embodiment of the connection element of FIG. 4-6, the section of the rivet 4 protruding beyond the surface facing away from the substrate can be used as a contact bump. The contact bump defines the point of contact with the soldering electrode and thus results in a reproducible introduction of energy during soldering. Particularly preferably, the protruding portion of the rivet has, for this, roughly the shape of a spherical segment.

Figure 1:
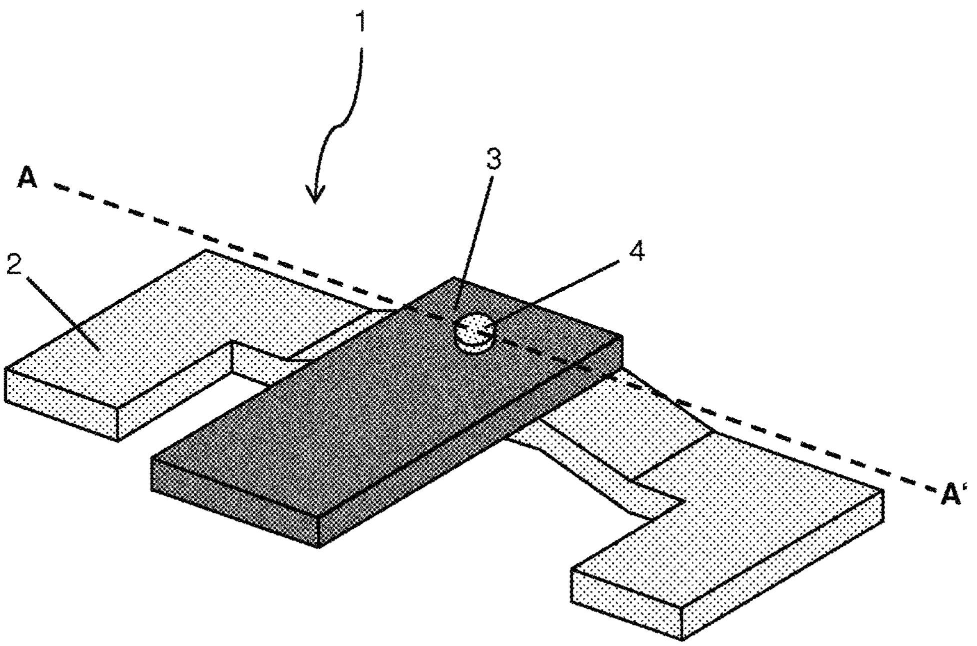
Figure 2:
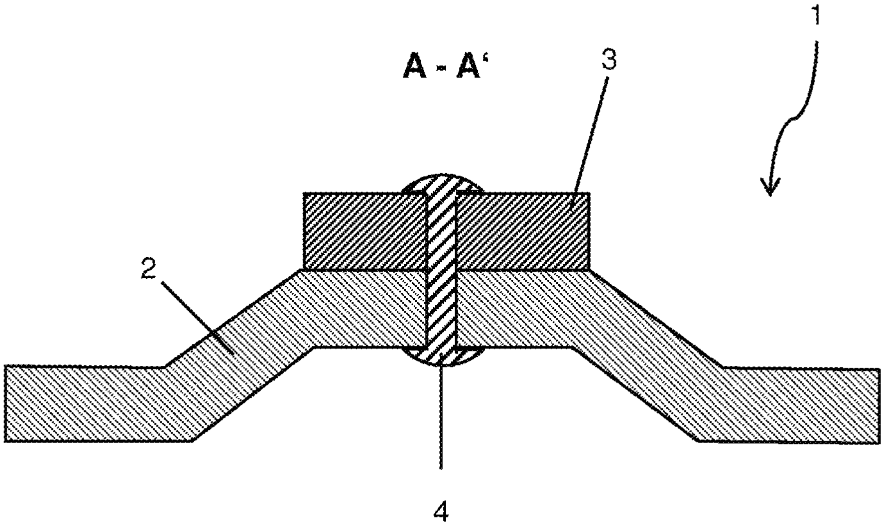
Figure 3:
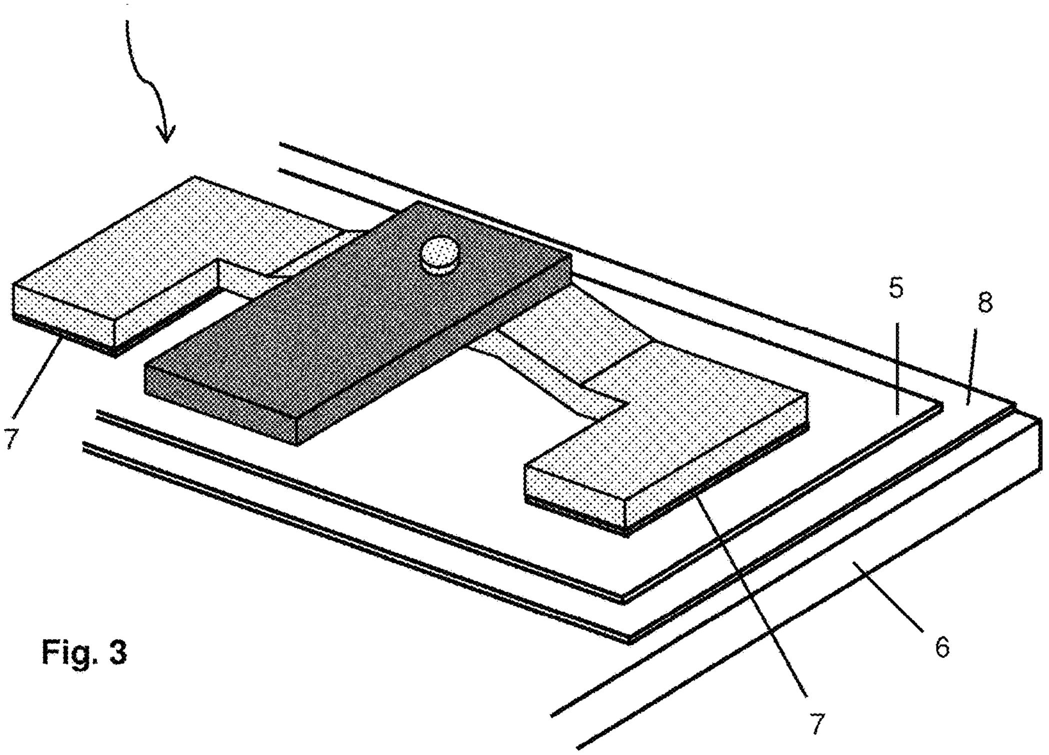
Figure 4:
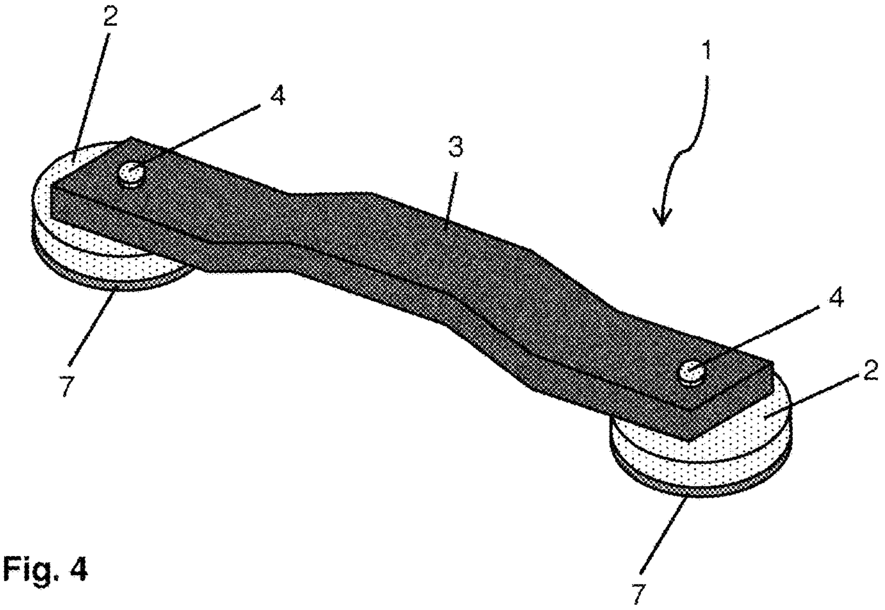
Figure 5:
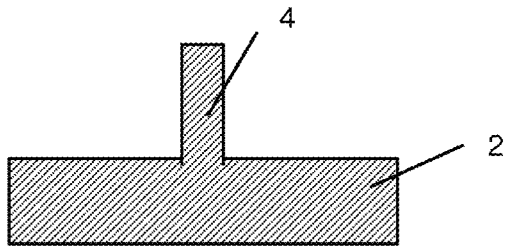
Figure 6:
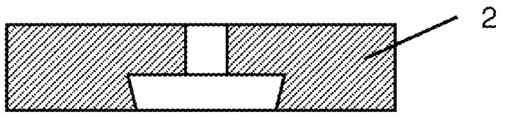
Figure 7:
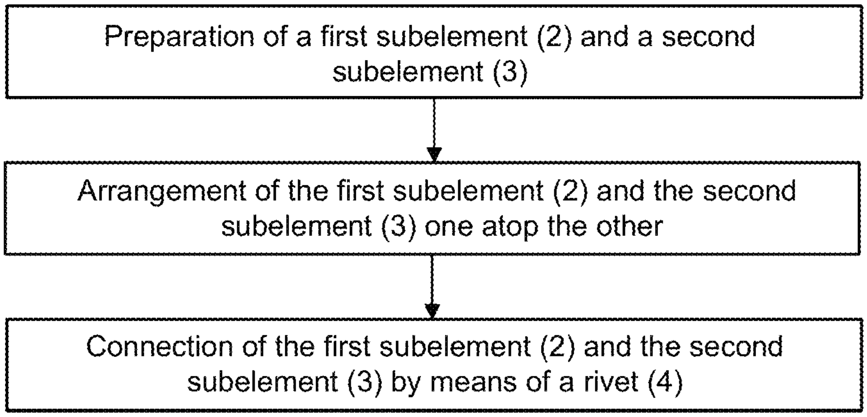
FIG. 7 depicts an exemplary embodiment of the method according to the invention for producing an electrical connection element 1.
Figure 8:
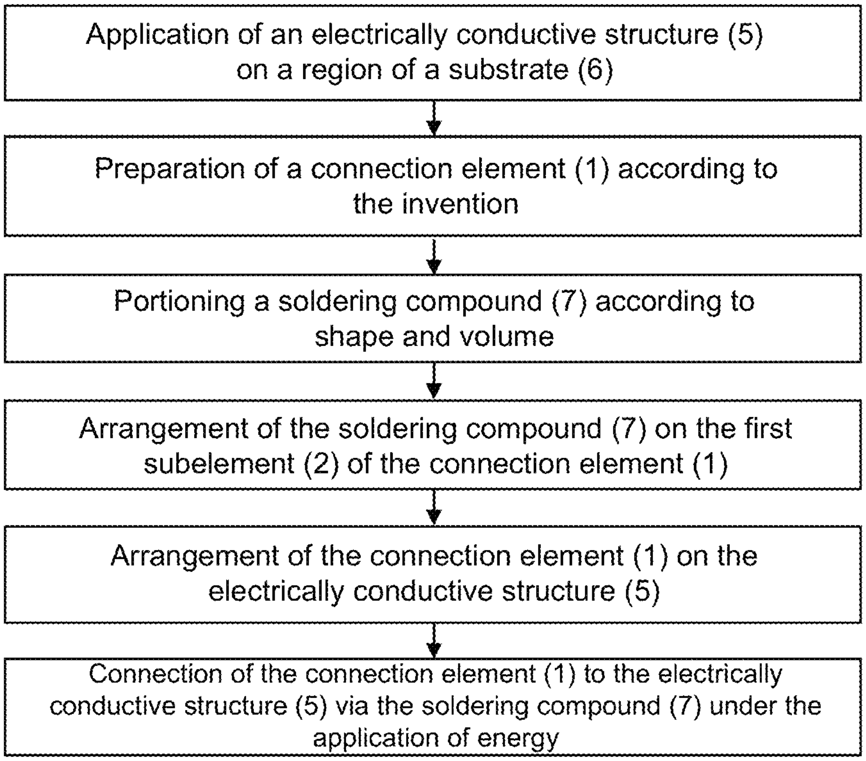
FIG. 8 depicts an exemplary embodiment of a method according to the invention for producing the pane according to the invention with a connection element 1 according to the invention.

LIST OF REFERENCE CHARACTERS (1) electrical connection element
(2) first subelement of 1
(3) second subelement of 1
(4) rivet
(5) electrically conductive structure
(6) substrate
(7) soldering compound
(8) masking print
A-A' section line

The invention claimed is:

1. A pane with at least one electrical connection element, comprising:
- a substrate;
- an electrically conductive structure on a region of the substrate; and
- at least one electrical connection element, comprising at least two first subelements, and a second subelement made from a material different than a material of the first subelement,
- wherein:
  - each of the two first subelements is connected via a lead-free soldering compound to a region of the electrically conductive structure,
  - a difference between a coefficient of thermal expansion of the substrate and a coefficient of thermal expansion of each of the two first subelements is less than $5\times10^{-6}/°$ C.,
  - the second subelement comprises two foot regions and a bridging region arranged therebetween,
  - each of the two first subelements is implemented as a flat plate,
  - each of the two first subelements is arranged on an underside of a respective one of the two foot regions between the second subelement and the substrate,
  - in an installed state of the pane, the second subelement is connected to an electrical connection cable,
  - each the two first subelements and the second subelement are connected to one another by at least one rivet,
  - each of the two first subelements comprises a depression region on a soldering face of said subelement, and
  - the depression region comprises a hole through which the at least one rivet is guided.

2. The pane according to claim 1, wherein a difference between a melting temperature of the material of the at least two first subelements and a melting temperature of the material of the second subelement is greater than 200° C.

3. The pane according to claim 1, wherein the at least two first subelements contain at least one iron-containing alloy.

4. The pane according to claim 1, wherein the second subelement contains copper or a copper-containing alloy.

5. The pane according to claim 1, wherein the at least one rivet contains one or more of: a) copper, b) brass, c) bronze, d) steel, e) aluminum alloys, and f) titanium.

6. The pane according to claim 1, wherein a thickness of the material of the at least two first subelements and a thickness of the material of the second subelement is from 0.1 to 4 mm.

7. The pane according to claim 1, wherein the second subelement is connected to an electrical connection cable.

8. The pane according to claim 1, wherein the substrate contains glass.

9. The pane according to claim 1, wherein the electrically conductive structure contains silver, and has a layer thickness from 5 μm to 40 μm.

10. The pane according to claim 1, wherein a difference between a melting temperature of the material of the at least two first subelements and a melting temperature of the material of the second subelement is greater than 300° C.

11. The pane according to claim 1, wherein a difference between a melting temperature of the material of the at least two first subelements and a melting temperature of the material of the second subelement is greater than 400° C.

12. The pane according to claim 1, wherein the at least one rivet contains copper or a copper-containing alloy.

13. The pane according to claim 1, wherein the at least one rivet is implemented in one piece with a first subelement of the at least two first subelements.

14. The pane according to claim 1, wherein a thickness of the material of the at least two first subelements and a thickness of the material of the second subelement is from 0.2 mm to 2 mm.

15. The pane according to claim 1, wherein a thickness of the material of the at least two first subelements and a thickness of the material of the second subelement is from 0.5 mm to 1 mm.

16. The pane according to claim 1, wherein a difference between a coefficient of thermal expansion of the substrate and a coefficient of thermal expansion of each of the at least two first subelements is less than $3\times10^{-6}/°$ C.

17. The pane according to claim 1, wherein the substrate contains soda lime glass.

18. The pane according to claim 1, wherein the electrically conductive structure contains at least silver particles and glass frits, and has a layer thickness from 5 μm to 40 μm.

19. A method comprising:

using the pane according to claim 1 in one or more of: a) buildings, b) means of transportation for travel on land, in the air, or on water, c) rail vehicles or motor vehicles, d) a windshield, e) a rear window, f) a side window, g) a roof panel, h) a heatable pane, and i) a pane with an antenna function.

20. The pane according to claim 1, wherein the depression region of each first subelement of the at least two first subelements is arranged in a middle region of the soldering face of said first subelement.

21. The pane according to claim 3, wherein the at least two first subelements contain at least one chromium-containing steel.

22. The pane according to claim 3, wherein each of the at least two first subelements contains 66.5 wt.-% to 89.5 wt.-% iron, 10.5 wt.-% to 20 wt.-% chromium, 0 wt.-% to 1 wt.-% carbon, 0 wt.-% to 5 wt.-% nickel, 0 wt.-% to 2 wt.-% manganese, 0 wt.-% to 2.5 wt.-% molybdenum, 0 wt.-% to 2 wt.-% niobium, and 0 wt.-% to 1 wt.-% titanium.

23. A method for producing a pane with at least one electrical connection element, the method comprising:

1) producing an electrical connection element for electrical contacting of an electrically conductive structure on a substrate through the following steps:
   a) preparing two first solid subelements and a second solid subelement, wherein:
      i) the first and second subelements are made of different materials,
      ii) each of the two first subelements comprises a depression region on a soldering face of said subelement, and the second subelement comprises two foot regions and a bridging region arranged therebetween, and
      iii) the second subelement for connection to an electrical connection cable,
   b) arranging the second subelement atop each of the two first subelements, and
   c) connecting each of the two first subelements to the second subelement by means of a respective rivet that is guided through a hole that is formed in the depression region of each of the two first subelements;
2) applying a lead-free soldering compound on a contact surface of each of the two first subelements of the produced electrical connection element;
3) arranging the produced electrical connection element with the applied lead-free soldering compound on a region of an electrically conductive structure that is applied on a region of a substrate; and
4) connecting the produced electrical connection element to the electrically conductive structure under application of energy, wherein a difference between a coefficient of thermal expansion of the substrate and a coefficient of thermal expansion of each of the two first subelements is less than $5\times10^{-6}/^\circ$ C., wherein each of the two first subelements is arranged on an underside of a respective one of the two foot regions between the second subelement and the substrate, and wherein each of the two first subelements is implemented as a flat plate.

* * * * *